United States Patent
Liu et al.

(10) Patent No.: US 9,138,733 B2
(45) Date of Patent: Sep. 22, 2015

(54) STABLE TIN FREE CATALYSTS FOR ELECTROLESS METALLIZATION

(75) Inventors: Feng Liu, Ashland, MA (US); Maria Anna Rzeznik, Shrewsbury, MA (US)

(73) Assignee: Rohm and Haas Electronic Materials LLC

(*) Notice: Subject to any disclaimer, the term of this patent is extended or adjusted under 35 U.S.C. 154(b) by 147 days.

(21) Appl. No.: 13/589,019

(22) Filed: Aug. 17, 2012

(65) Prior Publication Data

US 2013/0216713 A1    Aug. 22, 2013

Related U.S. Application Data

(60) Provisional application No. 61/524,416, filed on Aug. 17, 2011.

(51) Int. Cl.

| | |
|---|---|
| *B05D 3/04* | (2006.01) |
| *B05D 3/10* | (2006.01) |
| *B01J 21/00* | (2006.01) |
| *B01J 23/00* | (2006.01) |
| *B01J 25/00* | (2006.01) |
| *B01J 29/00* | (2006.01) |
| *B01J 31/00* | (2006.01) |
| *B01J 31/06* | (2006.01) |
| *B01J 23/44* | (2006.01) |
| *B01J 31/28* | (2006.01) |
| *B01J 35/00* | (2006.01) |
| *C23C 18/30* | (2006.01) |
| *C23C 18/20* | (2006.01) |
| *B01J 37/16* | (2006.01) |
| *B01J 37/02* | (2006.01) |
| *C23C 18/32* | (2006.01) |
| *C23C 18/38* | (2006.01) |

(52) U.S. Cl.
CPC ............... *B01J 31/061* (2013.01); *B01J 23/44* (2013.01); *B01J 31/28* (2013.01); *B01J 35/006* (2013.01); *B01J 35/0013* (2013.01); *B01J 37/0201* (2013.01); *B01J 37/0209* (2013.01); *B01J 37/0213* (2013.01); *B01J 37/16* (2013.01); *C23C 18/2086* (2013.01); *C23C 18/30* (2013.01); *B01J 2531/0272* (2013.01); *B01J 2531/824* (2013.01); *C23C 18/32* (2013.01); *C23C 18/38* (2013.01)

(58) Field of Classification Search
USPC .......................... 427/305; 502/100, 150, 300
See application file for complete search history.

(56) References Cited

U.S. PATENT DOCUMENTS

| | | | | |
|---|---|---|---|---|
| 4,015,992 | A | * | 4/1977 | Jung et al. .................... 106/1.26 |
| 4,725,314 | A | * | 2/1988 | Gulla et al. ................... 106/1.11 |
| 5,780,616 | A | * | 7/1998 | Fornasari et al. ............... 536/30 |

FOREIGN PATENT DOCUMENTS

WO    WO 2007001309 A2 *  1/2007

OTHER PUBLICATIONS

Lan, et al, "Mechanistic Study of Ag/Pd-PVP Nanoparticles and their Functions as Catalyst for Electroless Copper Deposition", Journal of the Electrochemical Society, 2008, pp. K77-K83, vol. 155, No. 4.

Cohen, et al, "The Chemistry of Palladium-Tin Colloid Sensitizing Processes," Journal of Colloid and Interface Science, 1976, pp. 156-162, vol. 55, No. 1.

Chen et al, "Chemical Preparation of Pd Nanoparticles in Room Temperature Ethylene Glycol System and Its Application to Electroless Copper Deposition," Journal of Colloid and Interface Science, 2006, pp. 143-150, vol. 297.

Lo, et al, "Synthesis of PVP Stabilized Cu/Pd Nanoparticles with Citrate Complexing Agent and Its Application as an Activator for Electroless Copper Deposition", Journal of Colloid and Interface Science, 2007, pp. 190-195, vol. 310.

Chen et al, "Aklanethiolate-Protected Palladium Nanoparticles", Chem. Mater., 2000, pp. 540-547, vol. 12.

Ganesan et al, "Monodisperse Thioether-Stabilized Palladium Nanoparticles: Synthesis, Characterization and Reactivity", Chem. Mater., 2007, pp. 3464-3471, vol. 19.

European Search Report of corresponding European Application No. 12 18 0773.

* cited by examiner

*Primary Examiner* — James McDonough

(57) ABSTRACT

Catalysts which include nanoparticles of palladium metal and cellulose derivatives are used in electroless metal plating. The palladium catalysts are free of tin.

4 Claims, No Drawings

STABLE TIN FREE CATALYSTS FOR ELECTROLESS METALLIZATION

This application claims the benefit of priority under 35 U.S.C. §119(e) to U.S. Provisional Application No. 61/524,416, filed Aug. 17, 2011, the entire contents of which application are incorporated herein by reference.

The present invention is directed to stable aqueous solutions of tin free palladium catalysts for electroless metallization. More specifically, the present invention is directed to stable aqueous solutions of tin free palladium catalysts for electroless metallization where the catalysts form nanoparticles of palladium metal and cellulose or cellulose derivatives.

Electroless metal deposition is a well-known process for depositing metallic layers on substrate surfaces. Electroless plating of a dielectric surface requires the prior application of a catalyst. The most commonly used method of catalyzing or activating dielectrics, such as non-conductive sections of laminated substrates used in the manufacture of printed circuit boards, is to treat the substrate with an aqueous tin/palladium colloid in an acidic chloride medium. The structure of the colloid has been extensively studied. In general, the colloid includes a palladium metal core surrounded by a stabilizing layer of tin(II) ions, essentially a shell of $SnCl_3^-$ complexes which act as surface stabilizing groups to avoid agglomeration of the colloids in suspension.

In the activation process the tin/palladium colloid catalyst is adsorbed onto a dielectric substrate, such as epoxy or polyimide containing substrate, to activate electroless metal deposition. Theoretically the catalyst functions as a carrier in the path of electron transfer from reducing agents to metal ions in the electroless metal plating bath. Although performance of electroless plating is influenced by many factors, such as additive composition of the plating solution, the activation step is key for controlling the rate and mechanism of electroless plating.

In recent years, along with the reduction in size and desired increase in the performance of electronic devices, the demand for defect free electronic circuits in the electronic packaging industry has become higher. Although the tin/palladium colloid has been commercially used as an activator for electroless metal plating for decades and has given acceptable service, it has many disadvantages which are becoming more pronounced as the demand for higher quality electronic devices increases. The stability of the tin/palladium colloid is a major concern. As mentioned above the tin/palladium colloid is stabilized by a layer of tin(II) ions and its counter anions can prevent palladium from agglomerating. The catalyst is sensitive to air and readily oxidizes to tin(IV), thus the colloid cannot maintain its colloidal structure. This oxidation is further promoted by increase in temperature and agitation during electroless plating. If the concentration of tin(II) falls to critical levels, such as close to zero, palladium metal particles grow in size, agglomerate and precipitate, thus becoming catalytically inactive. As a result there is an increase in demand for a more stable catalyst. In addition the high and fluctuating cost of palladium has encouraged the industry to search for a less costly metal.

Considerable efforts have been made to find new and improved catalysts. Because of the high cost of palladium, much effort has been directed toward development of palladium free catalysts, such as colloidal silver catalysts. Another direction that research has taken is towards a tin free palladium catalyst since stannous chloride is costly and the oxidized tin requires a separate acceleration step. The acceleration step is an extra step in the metallization process and it often strips off some catalyst on substrates, especially on substrates of glass fiber, causing voids on the plated substrate surface. However, such tin free catalysts have shown to be insufficiently active and reliable for through-hole plating in printed circuit board manufacture. Further, such catalysts typically become progressively less active upon storage, thus rendering such catalyst unreliable and impractical for commercial use.

Alternative stabilizing moieties for tin complexes, such as polyvinylpyrrolidone (PVP) and dendrimers, have been investigated. Stable and uniform PVP protected nanoparticles have been reported by various research groups in the literature. Other metal colloids, such as silver/palladium and copper/palladium in which palladium is partially replaced by less expensive metals have also been reported in the literature; however, such alternative catalysts have not been commercially acceptable. Ionic palladium variants have been used commercially, but they require an extra reducing step. Accordingly, there is still a need for a stable and reliable electroless metal plating catalyst.

Aqueous catalyst solutions include one or more antioxidant, nanoparticles of palladium metal and one or more compounds chosen from polymers having a formula:

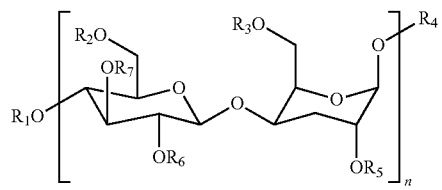

wherein $R_1$, $R_2$, $R_3$, $R_4$, $R_5$, $R_6$ and $R_7$ are the same or different and are chosen from —H, —$CH_2COOX$, —C(O)—$CH_3$, —C(O)—$(CH_2)_z$—$CH_3$ and

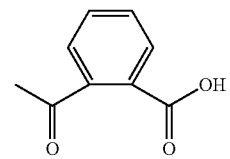

wherein n is an integer of at least 2, z is an integer of at least 1 and X is —H or a counter cation, and polymers of a reaction product of a polymer having a formula:

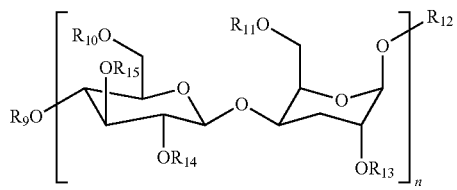

wherein $R_9$, $R_{10}$, $R_{11}$, $R_{12}$, $R_{13}$, $R_{14}$, and $R_{15}$ are the same or different and are chosen from —H, —$CH_3$, —$CH_2CH_3$, —$CH_2OH$, —$[CH_2CHR_8]_x$—OH, —$CH_2CH(OH)CH_3$ and —$(CH_2CHR_8O)_y$—H, with the proviso that at least one of $R_9$, $R_{10}$, $R_{11}$, $R_{12}$, $R_{13}$, $R_{14}$ and $R_{15}$ is —$CH_2OH$, —$[CH_2CHR_8]_x$—OH, —$CH_2CH(OH)CH_3$ or —$(CH_2CHR_8O)_y$—H, wherein $R_8$ is —H or —$CH_3$, x and y are integers of at least 1 and n and z are as described above, and a quaternary compound having a formula:

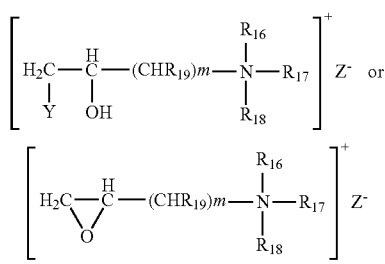

wherein m is an integer from 1 to 16, Y is halogen, $Z^-$ is a counter anion, $R_{16}$, $R_{17}$ and $R_{18}$ are the same or different and are —H, —$CH_3$ or —$(CH_2)_p$—$CH_3$, and $R_{19}$ is —H or —$CH_3$ and p is an integer of 1 to 9, and one or more cross-linking agents; and the catalyst is free of tin.

Methods include:
a) providing a substrate;
b) applying an aqueous catalyst solution to the substrate, the aqueous catalyst solution includes one or more antioxidants, nanoparticles of palladium metal and one or more compounds chosen from polymers having a formula:

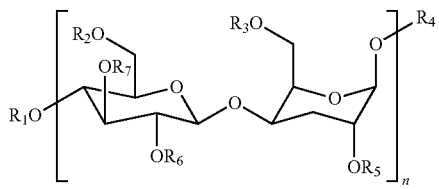

wherein $R_1$, $R_2$, $R_3$, $R_4$, $R_5$, $R_6$ and $R_7$ are the same or different and are chosen from —H, —$CH_2COOX$, —C(O)—$CH_3$, —C(O)—$(CH_2)_z$—$CH_3$ and

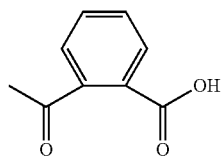

wherein n is an integer of at least 2, z is an integer of at least 1 and X is —H or a counter cation, and a reaction product of a polymer having a formula:

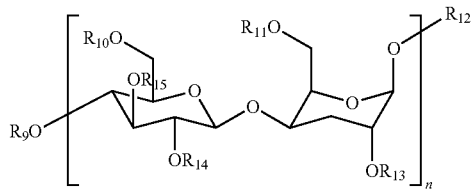

wherein $R_9$, $R_{10}$, $R_{11}$, $R_{12}$, $R_{13}$, $R_{14}$, and $R_{15}$ are the same or different and are chosen from —H, —$CH_3$, —$CH_2CH_3$, —$CH_2OH$, —$[CH_2CHR_8]_x$—OH, —$CH_2CH(OH)CH_3$ and —$(CH_2CHR_8O)_y$—H, with the proviso that at least one of $R_9$, $R_{10}$, $R_{11}$, $R_{12}$, $R_{13}$, $R_{14}$, and $R_{15}$ is —$CH_2OH$, —$[CH_2CHR_8]_x$—OH, —$CH_2CH(OH)CH_3$, —$(CH_2CHR_8O)_y$—H wherein $R_8$ is —H or —$CH_3$, x and y are integers of at least 1 and n and z are as described above, and a quaternary compound having a formula:

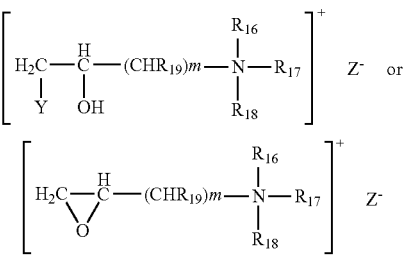

wherein m is an integer from 1 to 16, Y is halogen, $Z^-$ is a counter anion, $R_{16}$, $R_{17}$ and $R_{18}$ are the same or different and are —H, —$CH_3$ or —$(CH_2)_p$—$CH_3$, and $R_{19}$ is —H or —$CH_3$ and p is an integer of 1 to 9, and one or more cross-linking agents; and the catalyst is free of tin; and
c) electrolessly depositing metal onto the substrate using an electroless metal plating bath.

The catalysts may be used to electrolessly plate metals on substrates, including substrates of dielectric materials and are stable upon storage as well as during electroless metal plating since they do not readily oxidize as compared to conventional tin/palladium catalysts. The cellulose stabilizers function as do stannous chloride in conventional tin/palladium catalysts except that the cellulose stabilizers are biodegradable, thus they do not present an environmental hazard as does stannous chloride upon disposal. The cellulose stabilizers are available in large quantities with a fraction of the cost of stannous chloride. The raw materials used to make the stabilizers are readily available from plant life which is essentially ubiquitous. The cellulose stabilized palladium catalysts enable electroless metal plating without an acceleration step and enable good metal coverage of the substrate, even walls of through-holes of printed circuit boards.

As used throughout this specification, the abbreviations given below have the following meanings, unless the context clearly indicates otherwise: g=gram; mg=milligram; ml=milliliter; L=liter; cm=centimeter; m=meter; mm=millimeter; μm=micron; nm=nanometers; ppm=parts per million; ° C.=degrees Centigrade; g/L=grams per liter; DI=deionized; wt %=percent by weight; and $T_g$=glass transition temperature.

The terms "printed circuit board" and "printed wiring board" are used interchangeably throughout this specification. The terms "plating" and "deposition" are used interchangeably throughout this specification. All amounts are percent by weight, unless otherwise noted. All numerical ranges are inclusive and combinable in any order except where it is logical that such numerical ranges are constrained to add up to 100%.

Aqueous catalyst solutions include nanoparticles of palladium metal and one or more stabilizing polymers having a formula:

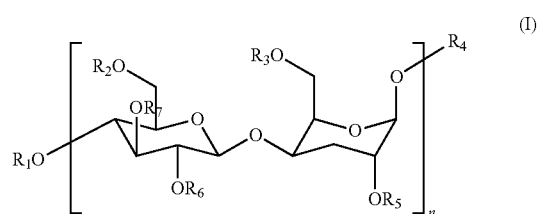

wherein R$_1$, R$_2$, R$_3$, R$_4$, R$_5$, R$_6$ and R$_7$ are the same or different and are chosen from —H, —CH$_2$COOX, —C(O)—CH$_3$, —C(O)—(CH$_2$)$_z$—CH$_3$ and

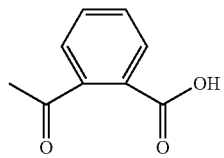

wherein n is an integer of at least 2, typically from 2 to 20, preferably from 2 to 15, more preferably from 5 to 10, z is an integer of at least 1, typically from 1 to 10, preferably from 2 to 5, and X is —H or a counter cation, such as sodium, potassium, ammonium ion or an alkaline earth metal, typically sodium or potassium. Preferably, at least one of R$_1$, R$_2$, R$_3$, R$_4$, R$_5$, R$_6$ and R$_7$ is, —C(O)—CH$_3$ or —CH$_2$COOX, more preferably, at least one of R$_2$, R$_3$, R$_5$, R$_6$ and R$_7$ is —CH$_2$COOX, and preferably when R$_1$, R$_2$, R$_3$, R$_4$, R$_5$, R$_6$ or R$_7$ is not —C(O)—CH$_3$ or —CH$_2$COOX, it is —H. Exemplary polymers are carboxymethyl cellulose and cellulose acetate. The catalyst is tin free.

The stabilizing polymers can also be a reaction product of a polymer having a formula:

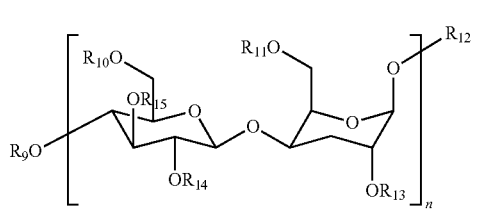

(II)

wherein R$_9$, R$_{10}$, R$_{11}$, R$_{12}$, R$_{13}$, R$_{14}$, and R$_{15}$ are the same or different and are chosen from —H, —CH$_3$, —CH$_2$CH$_3$, —CH$_2$OH, —[CH$_2$CHR$_8$]$_x$—OH, —CH$_2$CH(OH)CH$_3$ and —(CH$_2$CHR$_8$O)$_y$—H, with the proviso that at least one of R$_9$, R$_{10}$, R$_{11}$, R$_{12}$, R$_{13}$, R$_{14}$ and R$_{15}$ is —CH$_2$OH, —[CH$_2$CHR$_8$]$_x$—OH, —CH$_2$CH(OH)CH$_3$ or —(CH$_2$CHR$_8$O)$_y$—H, preferably, at least one of R$_{10}$, R$_{11}$, R$_{13}$, R$_{14}$ and R$_{15}$ is —[CH$_2$CHR$_8$]$_x$—OH or —(CH$_2$CHR$_8$O)$_y$—H, wherein R$_8$ is —H or —CH$_3$, x and y are integers of at least 1, typically from 1 to 10, preferably from 2 to 5 and n and z are as described above, and a quaternary compound having a formula:

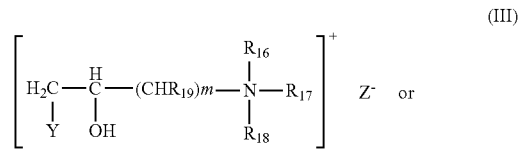

(III)

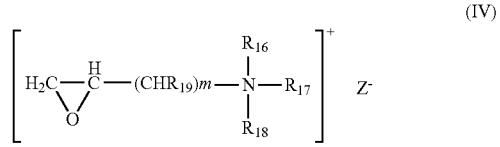

(IV)

wherein m is an integer from 1 to 16, Y is halogen, such as fluorine, chlorine, bromine or iodine, preferably the halogen is chlorine, Z$^-$ is a counter anion, such as a halide such as fluoride, chloride, bromide, or iodide, preferably chloride, nitrate, nitrite, phosphate, hydroxide or carboxylate, such as acetate or propionate, R$_{16}$, R$_{17}$ and R$_{18}$ are the same or different and are —H, —CH$_3$ or —(CH$_2$)$_p$—CH$_3$, and R$_{19}$ is —H or —CH$_3$ and p is an integer of 1 to 9, and one or more cross-linking agents. The catalyst is tin free. Exemplary quaternary compounds are glycidyl trimethylammonium chloride, 2,3-epoxypropyl-N,N,N-trimethylammonium chloride, 3-chloro-2-hydroxypropyl-N,N,N-trimethylammonium chloride, 3-chloro-2-hydroxypropyle-N,N,N-dimethylethanolammonium chloride and 1,3-bis-(3-chloro-2-hydroxypropyl-N,N-dimethylammonium)-N-propane dichloride. A preferred reaction product of the cellulose derivative and quaternary ammonium compound is the reaction product of hydroxyethyl cellulose and glycidyl trimethylammonium chloride.

Examples of cross-linking agents include, but are not limited to, formaldehyde, methylolated nitrogen compounds, such as dimethylolurea, dimethylolethyleneurea and dimethylolimidazolidone; dicarboxylic acids, such as maleic acid; dialdehydes, such as glyoxal; diepoxides, such as 1,2,3,4-diepoxybutane and 1,2,5,6-diepoxyhexane; diisocyantes; divinyl compounds, such as divinylsulfone; dihalogen compounds, such as dichloroacetone, dichloroacetic acid, 1,3-dichloropropan-2-ol, dichloroethane, 2,3-dibromo-1-propanol, 2,3-dichloro-1-propanol and 2,2-dichloroethyl ether; halohydrins, such as epichlorohydrine; bis(epoxypropyl) ether; vinylcyclohexenedioxide; ethylene glycol-bis(epoxypropyl)ether; vinylcyclohexenedioxide; ethylene glycol-bis(epoxypropyl)ether; 1,3-bis(β-hyroxy-Γ-chloropropoxy) ether; 1,3-bis(β-hydroxy-Γ-chloropropoxy)ethane; methylenebis(acrylamide); N,N'-dimethylol(methylenebis(acrylamide)); triacrylolhexahydrotriazine; acrylamidomethylene chloroacetamide; 2,4,6-trichloropyrimidine; 2,4,5,6-tetrachloropyrimidine; cyanuric chloride; triallylcyanurate phosphorusoxychloride; bis(acrylamido)acetic acid; di-epoxy compounds and haloepxoy compounds, such as 1,3-bis(glycidyldimethylammonium)propanedichloride and epichlorohydrin. The preferred cross-linking agents are the di-epoxy and haloepoxy compounds.

The polymers may be made by known methods in the art and literature and many are commercially available. An example of commercially available sodium carboxymethyl cellulose is AQUALON by Ashland and a commercially available polymer of hydroxyethyl cellulose and glycidyl trimethylammonium chloride is UCARE JR-125 available from Amerchol Corporation. Methods for making the cellulose and cellulose derivatives and quaternary ammonium compound polymers are disclosed in U.S. Pat. No. 5,780,616.

The weight average molecular weights of the polymers may vary. Typically they range from 10,000 and greater, more typically from 10,000 to 300,000.

The stabilizing polymers are included in the aqueous catalyst solutions in sufficient amounts to provide nanoparticle stabilization. Mixtures of the various stabilizing polymers described above may be included in the aqueous catalysts. Minor experimentation may be required to determine the amount of a particular stabilizer or combination of stabilizers to stabilize a given metal nanoparticle. In general, one or more stabilizing polymers are included in the aqueous catalyst solutions in amounts of 10 mg/L to 10 g/L, preferably from 20 mg/L to 1 g/L.

One or more antioxidants are included in the aqueous catalyst solutions. Conventional antioxidants may be included and may be included in conventional amounts. Typically antioxidants are included in amounts of 0.1 g/l to 10 g/l, preferably from 0.2 g/L to 5 g/L. Such antioxidants include, but are not limited to, ascorbic acid, phenolic acid, polyphenolic compounds, such as but not limited to, hydroxybenzoic acid and derivatives, gallic acid, hydroxybenzoaldehydes, catechol, hydroquinone, catechin and flavonoids.

One or more reducing agents are included to reduce palladium ions to palladium metal. Conventional reducing agents known to reduce palladium ions to palladium metal may be used. Such reducing agents include, but are not limited to, dimethylamine borane, sodium borohydride, ascorbic acid, iso-ascorbic acid, sodium hypophosphite, hydrazine hydrate, formic acid and formaldehyde. Reducing agents are included in amounts to reduce substantially all of the palladium ions to palladium metal. Such amounts are generally conventional amounts and are well known by those of skill in the art.

Sources of palladium metal include any water soluble palladium salt. Such salts are included to provide palladium metal in amounts of 10 ppm to 5000 ppm, preferably from 300 ppm to 1500 ppm. Water soluble palladium salts include, but are not limited to, palladium sodium chloride, palladium chloride, palladium acetate, palladium potassium chloride and palladium nitrate.

The components which make up the aqueous catalyst may be combined in any order. Any suitable method known in the art and literature may be used to prepare the aqueous catalyst solution. While the specific parameters and amounts of components may vary from one method to the other, in general, one or more of the stabilizing polymers is first solubilized in a sufficient amount of water. One or more sources of palladium metal as an aqueous solution is combined with the stabilizer solution with vigorous agitation to form a uniform mixture. An aqueous solution containing one or more reducing agents is then mixed with the mixture of stabilizers and palladium salts with vigorous agitation to reduce the palladium ions to palladium metal. The process steps and solution are typically done at room temperature; however, temperatures may be varied to assist in solubilizing reaction components and to encourage reduction of palladium ions to palladium metal. While not being bound by theory, the stabilizers may coat or surround portions or most of the palladium particles to stabilize the catalyst solution. The particles of palladium metal and stabilizer range in size from 1 nm to 1000 nm or such as from 2 nm to 500 nm. Preferably the particles range in size from 2 nm to 300 nm, more preferably from 2 nm to 100 nm, most preferably from 2 nm to 10 nm.

One or more acids may be added to the catalyst to provide a pH range of less than 7, preferably from 1-6.5, more preferably from 2-6. Inorganic or organic acids may be used in sufficient amounts to maintain the pH at the desired range. Mixtures of inorganic and organic acids also may be used. Examples of inorganic acids are hydrochloric acid, sulfuric acid and nitric acid. Organic acids include mono- and polycarboxylic acids, such as dicarboxylic acids. Examples of organic acids are benzoic acid and its derivatives, such as hydroxybenzoic acid, ascorbic acid, iso-ascorbic acid, malic acid, maleic acid, gallic acid, acetic acid, citric acid and tartaric acid.

The catalysts may be used to electrolessly metal plate various substrates which are known to be capable of being electrolessly metal plated. Substrates include, but are not limited to, materials including inorganic and organic substances such as glass, ceramics, porcelain, resins, paper, cloth and combinations thereof. Metal-clad and unclad materials also are substrates which may be metal plated using the catalyst.

Substrates also include printed circuit boards. Such printed circuit boards include metal-clad and unclad with thermosetting resins, thermoplastic resins and combinations thereof, including fiber, such as fiberglass, and impregnated embodiments of the foregoing.

Thermoplastic resins include, but are not limited to, acetal resins, acrylics, such as methyl acrylate, cellulosic resins, such as ethyl acetate, cellulose propionate, cellulose acetate butyrate and cellulose nitrate, polyethers, nylon, polyethylene, polystyrene, styrene blends, such as acrylonitrile styrene and copolymers and acrylonitrile-butadiene styrene copolymers, polycarbonates, polychlorotrifluoroethylene, and vinylpolymers and copolymers, such as vinyl acetate, vinyl alcohol, vinyl butyral, vinyl chloride, vinyl chloride-acetate copolymer, vinylidene chloride and vinyl formal.

Thermosetting resins include, but are not limited to, allyl phthalate, furane, melamine-formaldehyde, phenol-formaldehyde and phenol-furfural copolymers, alone or compounded with butadiene acrylonitrile copolymers or acrylonitrile-butadiene-styrene copolymers, polyacrylic esters, silicones, urea formaldehydes, epoxy resins, allyl resins, glyceryl phthalates and polyesters.

Porous materials include, but are not limited to paper, wood, fiberglass, cloth and fibers, such as natural and synthetic fibers, such as cotton fibers and polyester fibers.

The catalysts may be used to plate both low and high $T_g$ resins. Low $T_g$ resins have a $T_g$ below 160° C. and high $T_g$ resins have a $T_g$ of 160° C. and above. Typically high $T_g$ resins have a $T_g$ of 160° C. to 280° C. or such as from 170° C. to 240° C. High $T_g$ polymer resins include, but are not limited to, polytetrafluoroethylene (PTFE) and polytetrafluoroethylene blends. Such blends include, for example, PTFE with polypheneylene oxides and cyanate esters. Other classes of polymer resins which include resins with a high Tg include, but are not limited to, epoxy resins, such as difunctional and multifunctional epoxy resins, bimaleimide/triazine and epoxy resins (BT epoxy), epoxy/polyphenylene oxide resins, acrylonitrile butadienestyrene, polycarbonates (PC), polyphenylene oxides (PPO), polypheneylene ethers (PPE), polyphenylene sulfides (PPS), polysulfones (PS), polyamides, polyesters such as polyethyleneterephthalate (PET) and polybutyleneterephthalate (PBT), polyetherketones (PEEK), liquid crystal polymers, polyurethanes, polyetherimides, epoxies and composites thereof.

The catalyst may be used to deposit metals on the walls of through-holes or vias of printed circuit boards. The catalysts may be used in both horizontal and vertical processes of manufacturing printed circuit boards.

The aqueous catalysts may be used with conventional electroless metal plating baths. While it is envisioned that the catalysts may be used to electrolessly deposit any metal which may be electrolessly plated, typically, the metal is chosen from copper, copper alloys, nickel or nickel alloys. More typically the metal is chosen from copper and copper alloys, most typically copper is used.

Conventional electroless copper or copper alloy baths may be used. Typically sources of copper ions include, but are not limited to, water soluble halides, nitrates, acetates, sulfates and other organic and inorganic salts of copper. Mixtures of one or more of such copper salts may be used to provide copper ions. Examples include copper sulfate, such as copper sulfate pentahydrate, copper chloride, copper nitrate, copper hydroxide and copper sulfamate. Conventional amounts of copper salts may be used in the compositions. Copper ion concentrations in the composition may range from 0.5 g/L to 30 g/L or such as from 1 g/L to 20 g/L or such as from 5 g/L to 10 g/L.

One or more alloying metals also may be included in the electroless compositions. Such alloying metals include, but are not limited to, nickel and tin. Examples of copper alloys include copper/nickel and copper/tin. Typically the copper alloy is copper/nickel.

Sources of nickel ions for nickel and nickel alloy electroless baths may include one or more conventional water soluble salts of nickel. Sources of nickel ions include, but are not limited to, nickel sulfates and nickel halides. Sources of nickel ions may be included in the electroless alloying compositions in conventional amounts. Typically sources of nickel ions are included in amounts of 0.5 g/L to 10 g/L or such as from 1 g/1 to 5 g/L.

The method steps used in metalizing a substrate may vary depending on whether the surface to be plated is metal or dielectric. Conventional steps used for electrolessly metal plating a substrate may be used with the catalysts; however, the aqueous polymer stabilized palladium catalysts do not require an acceleration step as in many conventional electroless plating processes. Accordingly, acceleration steps are preferably excluded when using the catalyst. In general, the catalyst is applied to the surface of the substrate to be electrolessly plated with a metal followed by application of the metal plating bath. Electroless metal plating parameters, such as temperature and time may be conventional. Conventional substrate preparation methods, such as cleaning or degreasing the substrate surface, roughening or micro-roughening the surface, etching or micro-etching the surface, solvent swell applications, desmearing through-holes and various rinse and anti-tarnish treatments may be used. Such methods and formulations are well known in the art and disclosed in the literature.

In general, when the substrate to be metal plated is a dielectric material such as on the surface of a printed circuit board or on the walls of through-holes, the boards are rinsed with water and cleaned and degreased followed by desmearing the through-hole walls. Typically prepping or softening the dielectric surface or desmearing of the through-holes begins with application of a solvent swell.

Any conventional solvent swell may be used. The specific type may vary depending on the type of dielectric material. Examples of dielectrics are disclosed above. Minor experimentation may be done to determine which solvent swell is suitable for a particular dielectric material. The $T_g$ of the dielectric often determines the type of solvent swell to be used. Solvent swells include, but are not limited to, glycol ethers and their associated ether acetates. Conventional amounts of glycol ethers and their associated ether acetates may be used. Examples of commercially available solvent swells are CIRCUPOSIT CONDITIONER™ 3302, CIRCUPOSIT HOLE PREP™ 3303 and CIRCUPOSIT HOLE PREP™ 4120 (obtainable from Rohm and Haas Electronic Materials, Marlborough, Mass.).

Optionally, the substrate and through-holes are rinsed with water. A promoter is then applied. Conventional promoters may be used. Such promoters include sulfuric acid, chromic acid, alkaline permanganate or plasma etching. Typically alkaline permanganate is used as the promoter. An example of a commercially available promoter is CIRCUPOSIT PROMOTER™ 4130 available from Rohm and Haas Electronic Materials, Marlborough, Mass.

Optionally, the substrate and through-holes are rinsed again with water. A neutralizer is then applied to neutralize any residues left by the promoter. Conventional neutralizers may be used. Typically the neutralizer is an aqueous alkaline solution containing one or more amines or a solution of 3 wt % peroxide and 3 wt % sulfuric acid. Optionally, the substrate and through-holes are rinsed with water and then dried.

After the solvent swelling and desmearing an acid or alkaline conditioner may be applied. Conventional conditioners may be used. Such conditioners may include one or more cationic surfactants, non-ionic surfactants, complexing agents and pH adjusters or buffers. Examples of commercially available acid conditioners are CIRCUPOSIT CONDITIONER™ 3320 and CIRCUPOSIT CONDITIONER™ 3327 available from Rohm and Haas Electronic Materials, Marlborough, Mass. Suitable alkaline conditioners include, but are not limited to, aqueous alkaline surfactant solutions containing one or more quaternary amines and polyamines. Examples of commercially available alkaline surfactants are CIRCUPOSIT CONDITIONER™ 231, 3325, 813 and 860 available from Rohm and Haas Electronic Materials. Optionally, the substrate and through-holes are rinsed with water.

Conditioning may be followed by micro-etching. Conventional micro-etching compositions may be used. Micro-etching is designed to provide a micro-roughened metal surface on exposed metal (e.g. innerlayers and surface etch) to enhance subsequent adhesion of deposited electroless and later electroplate. Micro-etches include, but are not limited to, 60 g/L to 120 g/L sodium persulfate or sodium or potassium oxymonopersulfate and sulfuric acid (2%) mixture, or generic sulfuric acid/hydrogen peroxide. An example of a commercially available micro-etching composition is CIRCUPOSIT MICROETCH™ 3330 available from Rohm and Haas Electronic Materials. Optionally, the substrate is rinsed with water.

Optionally a pre-dip is then applied to the micro-etched substrate and through-holes. Conventional pre-dip aqueous solutions of inorganic or organic acids with a pH range typically from 3-5 may be used. An example of an inorganic acid solution is 2% to 5% hydrochloric acid. Optionally, the substrate is rinsed with cold water.

A stabilized nanoparticle catalyst is then applied to the substrate and through-holes. The substrate and through-holes optionally may be rinsed with water after application of the catalyst.

The substrate and walls of the through-holes are then plated with metal, such as copper, copper alloy, nickel or nickel alloy with an electroless bath. Typically copper is plated on the walls of the through-holes. Plating times and temperatures may be conventional. Typically metal deposition is done at temperatures of 20° C. to 80°, more typically from 30° C. to 60° C. The substrate may be immersed in the electroless plating bath or the electroless may be sprayed onto the substrate. Typically, deposition may be done for 5 seconds to 30 minutes; however, plating times may vary depending on the thickness of the metal on the substrate.

Optionally anti-tarnish may be applied to the metal. Conventional anti-tarnish compositions may be used. An example of a commercially available anti-tarnish is ANTI TARNISH™ 7130 (available from Rohm and Haas Electronic Materials). The substrate may optionally be rinsed and then the boards may be dried.

Further processing may include conventional processing by photoimaging and further metal deposition on the substrates such as electrolytic metal deposition of, for example, copper, copper alloys, tin and tin alloys.

The catalysts may be used to electrolessly plate metals on substrates, including substrates of dielectric materials and are stable upon storage as well as during electroless metal plating since they do not readily oxidize as compared to conventional tin/palladium catalysts. The cellulose stabilizers function as do stannous chloride in conventional tin/palladium catalysts except that the cellulose stabilizers are biodegradable, thus they do not present an environmental hazard as does stannous chloride upon disposal. The cellulose stabilizers are available in large quantities with a fraction of the cost of stannous chloride. The raw materials used to make the stabilizers are readily available from plant life which is essentially ubiquitous. The cellulose stabilized palladium catalysts enable electroless metal plating without an acceleration step and enable good metal coverage of the substrate, even walls of through-holes of printed circuit boards.

The following examples are not intended to limit the scope of the invention but are intended to further illustrate it.

EXAMPLE 1

Carboxymethyl cellulose/palladium catalysts were prepared by dissolving 40 mg carboxymethyl cellulose sodium salt in a beaker containing 250 ml DI water at room temperature. With stirring, 172 mg $Na_2PdCl_4$ in 10 ml DI water was added and the mixture was vigorously mixed. 250 mg $NaBH_4$ in 10 ml DI water was added to the solution mixture with very strong agitation. The solution quickly changed from yellow to black, indicating reduction of palladium ions to palladium metal. The average particle size of the palladium metal was 5 nm. The particles were measured with a transmission electron microscope. The solution of the as-synthesized catalyst had a pH between 8 and 9 as measured using an ACCUMET AB15 pH meter from Fisher Scientific. The beaker containing the aqueous catalyst solution was placed in a 50° C. water bath for 12 hours to test its stability. After 12 hours the solution was observed and there was no observable precipitate indicating that the catalyst was still stable.

The catalyst solution was used as a stock solution and 8 aliquots were diluted to nanoparaticle concentrations of 25 ppm. The pH of the aliquots was adjusted to 3.5 with ascorbic acid.

Six different laminates were tested: NP-175, 370 HR, TUC-752, SY-1141, SY-1000-2, and FR-408. NP-175 was obtained from Nanya, 370 HR and FR-408 were obtained from Isola, TUC-752 was obtained from Taiwan Union Technology Corporation and SY-1141 and SY-1000 were obtained from Shengyi. The $T_g$ values ranged from 140° C. to 180° C. Each laminate was 5 cm×12 cm. A surface of each laminate was treated as follows:

1. Each laminate was immersed into a solvent swell which included ethylene glycol dimethyl ether and water at a volume to volume ratio of 1:2 for 7 minutes at 80° C.;
2. Each laminate was then removed from the solvent swell and rinsed with cold tap water for 4 minutes;
3. Each laminate was then treated with a permanganate aqueous solution which included 1% potassium permanganate at a pH above 10 at 80° C. for 10 minutes;
4. Each laminate was then rinsed for 4 minutes in cold tap water;
5. The laminates were then treated with a neutralizer solution of 3 wt % peroxide and 3 wt % sulfuric acid for 2 minutes at room temperature;
6. Each laminate was then rinsed with cold tap water for 4 minutes;
7. Each laminate was then immersed in an aqueous bath containing 3% CIRCUPOSIT CONDITIONER™ 231 aqueous acid conditioner for 5 minutes at 40° C.;
8. Each laminate was then rinsed with cold tap water for 4 minutes;
9. MICROETCH™ 748 solution was then applied to each laminate for 2 minutes at room temperature to microetch the laminates;
10. The laminates were then rinsed with cold tap water for 4 minutes;
11. The laminates were then primed for 6 minutes at 40° C. with one or the aliquots of carboxymethyl cellulose/palladium catalyst prepared above;
12. The laminates were then rinsed with cold water for 5 minutes;
13. The laminates were then immersed in CIRCUPOSIT™ 880 electroless copper plating bath at 40° C. and at a pH of 13 and copper was deposited on the substrates for 18 minutes;
14. The copper plated laminates were then rinsed with cold water for 2 minutes;
15. Each copper plated laminate was then placed into a conventional convection oven and dried for 20 minutes at 105° C.;
16. After drying each copper plated laminate was placed in a conventional laboratory dessicator for 20 minutes or until it cooled to room temperature; and
17. Each copper laminate was then tested for adhesion using the conventional Scotch tape test method.

All of the plated copper laminates passed the Scotch tape test. There was no observable copper metal stuck to the Scotch tape after removal of the tape from the copper laminates.

EXAMPLE 2

A 25 ppm aqueous carboxymethyl cellulose/palladium catalyst was prepared as described in Example 1. The pH of this catalyst solution was adjusted to pH 3.5 with ascorbic acid. The average particle size of the palladium metal was determined to be 5 nm. The six types of laminates described above each with a plurality of through-holes were provided. The through-holes were made conductive by the same process steps and parameters as described in Example 1 for the surface treatment of the laminates. After the catalyst was applied the through-holes were electrolessly plated with the same electroless copper bath described in Example 1.

After plating each board was sectioned laterally to expose the copper plated walls of the through-holes. Multiple lateral sections 1 mm thick were taken from the walls of the sectioned through-holes of each board to determine the through-hole wall coverage for the boards. The European Backlight Grading Scale was used. The 1 mm sections from each board were placed under a conventional optical microscope of 50× magnification. The quality of the copper deposits was determined by the amount of light that was observed under the microscope. If no light was observed the section was completely black and was rated a 5 on the backlight scale indicating complete copper coverage of the through-hole. If light passed through the entire section without any dark areas, this indicated that there was very little to no copper metal deposition on the wall and the section was rated 0. If sections had some dark regions as wells as light regions, they were rated between 0 and 5. The backlight ratings for the 25 ppm carboxymethyl cellulose/palladium catalyst on the six laminates ranged from 4.5 and higher on the 5 scale, which indicates that the catalyst is generally acceptable for commercial use by industry standards.

What is claimed is:

1. An aqueous catalyst solution consisting of one or more antioxidants, nanoparticles of palladium metal and one or more compounds chosen from polymers having a formula:

13

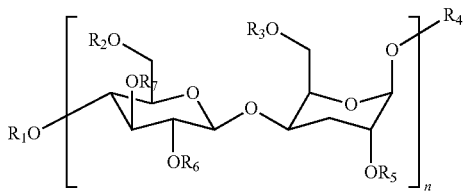

wherein $R_1$, $R_2$, $R_3$, $R_4$, $R_5$, $R_6$ and $R_7$ are the same or different and chosen from —H, —CH$_2$COOX, —C(O)—CH$_3$, —C(O)—(CH$_2$)$_z$—CH$_3$ and

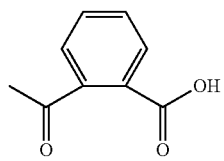

wherein n is an integer of at least 2, z is an integer of at least 1 and X is —H or a counter cation, and a reaction product of a polymer having a formula:

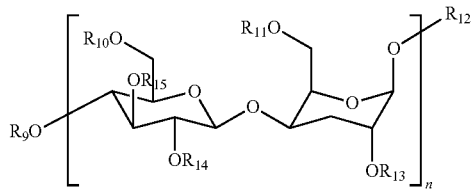

14 wherein $R_9$, $R_{10}$, $R_{11}$, $R_{12}$, $R_{13}$, $R_{14}$, and $R_{15}$ are the same or different and are chosen from —H, —CH$_3$, —CH$_2$CH$_3$, —CH$_2$OH, —[CH$_2$CHR$_8$]$_x$—OH, —CH$_2$CH(OH)CH$_3$ and —(CH$_2$CHR$_8$O)$_y$—H, with the proviso that at least one of $R_9$, $R_{10}$, $R_{11}$, $R_{12}$, $R_{13}$, $R_{14}$, and $R_{15}$ is —CH$_2$OH, —[CH$_2$CHR$_8$]$_x$—OH, —CH$_2$CH(OH)CH$_3$ or —(CH$_2$CHR$_8$O)$_y$—H, wherein $R_8$ is —H or —CH$_3$, x and y are integers of at least 1 and n and z are as described above, and a quaternary compound having a formula:

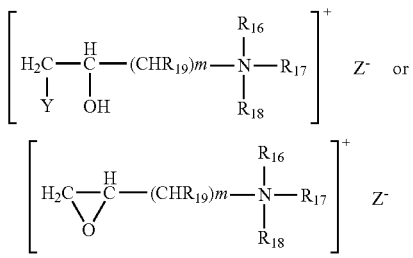

wherein m is an integer from 1 to 16, Y is halogen, $Z^-$ is a counter anion, $R_{16}$, $R_{17}$ and $R_{18}$ are the same or different and are —H, —CH$_3$ or —(CH$_2$)$_p$—CH$_3$, and $R_{19}$ is —H or —CH$_3$ and p is an integer of 1 to 9, and one or more cross-linking agents, the catalyst is free of tin.

2. The aqueous catalyst of claim 1, wherein at least one of $R_2$, $R_3$, $R_5$, $R_6$ and $R_7$ is —CH$_2$COOX or —C(O)—CH$_3$.

3. The aqueous catalyst of claim 1, wherein the nanoparticles are 1 nm to 1000 nm.

4. The aqueous catalyst of claim 1, wherein the cross-linking agent is chosen from one or more of haloepoxy compounds and di-epoxy compounds.

* * * * *